United States Patent [19]
Ouchi

[11] Patent Number: 5,067,811
[45] Date of Patent: Nov. 26, 1991

[54] ILLUMINANCE DISTRIBUTION MEASURING SYSTEM

[75] Inventor: Chidane Ouchi, Kawasaki, Japan

[73] Assignee: Canon Kabushiki Kaisha, Tokyo, Japan

[21] Appl. No.: 542,652

[22] Filed: Jun. 25, 1990

Related U.S. Application Data

[63] Continuation of Ser. No. 186,067, Apr. 25, 1988, abandoned.

[30] Foreign Application Priority Data

Apr. 28, 1987 [JP] Japan .................... 62-103026

[51] Int. Cl.$^5$ .................... G01J 1/00
[52] U.S. Cl. .................... 356/121
[58] Field of Search .................... 356/121, 73

[56] References Cited

U.S. PATENT DOCUMENTS 4,320,462 3/1982 Lund et al. .................... 356/121
4,619,508 10/1986 Shibuya et al. .
4,799,791 1/1989 Echizen et al. .................... 356/121

FOREIGN PATENT DOCUMENTS 60-168026 8/1985 Japan .

Primary Examiner—Samuel Turner
Attorney, Agent, or Firm—Fitzpatrick, Cella, Harper & Scinto

[57] ABSTRACT

An illuminance distribution measuring system which includes a two-dimensional (area) sensor array to be disposed on the surface being illuminated by a pulsed laser beam from a pulsed laser and a signal processor operable, in response to output signals of the sensor array, to detect the illuminance distribution on the surface being illuminated.

32 Claims, 1 Drawing Sheet

ILLUMINANCE DISTRIBUTION MEASURING SYSTEM

This application is a continuation of application Ser. No. 07/186,067 filed Apr. 25, 1988, now abandoned.

FIELD OF THE INVENTION AND RELATED ART

This invention relates to an illuminance distribution measuring system. More particularly, the invention is concerned with such a measuring system suitably usable with a semiconductor microcircuit manufacturing exposure apparatus having, as a light source, a pulsed laser such as an excimer laser, for example, for measuring an illuminance distribution on the surface of a mask or wafer.

Conventional illuminance distribution measuring systems include a photodetector which has a small light-receiving surface and which is moved along the surface being illuminated. From the variation in the output signal of such a photodetector, the illuminance distribution on the surface being illuminated is measured.

However, when a light source (illumination source) is provided by a pulsed laser, such as an excimer laser, wherein the light intensity or the light intensity distribution easily changes for each pulse of light, a conventional illuminance distribution measuring system as described above does not ensure correct measurement of illuminance unevenness.

In an attempt to avoid such an inconvenience, a proposal has been made in Japanese Laid-Open Patent Application, Laid-Open No. Sho 60-168026, filed in Japan in the name of the assignee of the subject application. According to this proposal, there, are provided a first photodetector fixedly secured at a position which is predetermined with respect to the surface being illuminated and a second photodetector movable along the surface being illuminated. On the basis of the output signals of these photodetectors, the illuminance distribution is measured.

While the proposed measuring system assures correct measurement of the illuminance distribution irrespective of variation in the intensity of a pulsed laser beam from a pulsed laser source, the necessity of scanning movement of the second photodetector is not effective to ensure high-speed measurement.

SUMMARY OF THE INVENTION

It is accordingly a primary object of the present invention to provide an improved illuminance distribution measuring system capable of measuring, in a reduced time, the illuminance distribution on the surface being illuminated by a pulsed laser beam.

Briefly, according to one aspect of the present invention, to achieve the above object, there is provided an illuminance distribution measuring system which includes a two-dimensional (area) sensor array to be disposed on the surface being illuminated by a pulsed laser beam from a pulsed laser and a signal processor operable, in response to output signals of the sensor array, to detect the illuminance distribution on the surface being illuminated.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
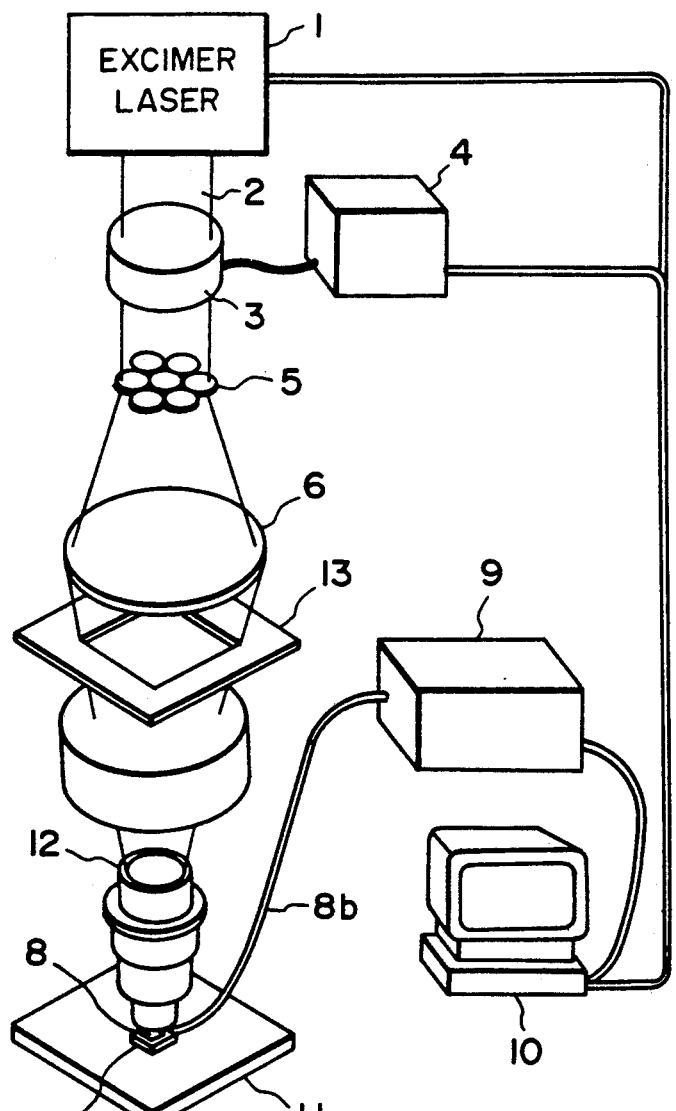
FIG. 1 is a schematic view of a semi-conductor microcircuit manufacturing exposure apparatus into which an illuminance distribution measuring system according to an embodiment of the present invention is incorporated.

Referring first to FIG. 1, there is shown a general structure of a semiconductor microcircuit manufacturing exposure apparatus which includes an excimer laser, provided as a light source, and into which a illuminance distribution measuring system according to one embodiment of the preset invention is incorporated.

As shown in FIG. 1, the exposure apparatus includes an excimer laser 1 which is a light source and which produces a pulsed laser beam 2 (i.e. a light in the form of pulses); a beam scanner 3 for scanningly deflecting the light beam 2 from the excimer laser 1; a driving device 4 for actuating the beam scanner 3; and a fly's-eye lens system 5 for receiving the light from the scanner 3 and for forming a plurality of secondary light sources. The beam scanner 3 acts on the light 2 so that it is incident upon the fly's-eye lens system 5 with a variable angle of incidence. The exposure apparatus further includes a condenser lens 6; a reticle stage 13 for holding a reticle, not shown; a reduction projection lens system 12 for projecting a circuit pattern of a reticle, held by the reticle stage 13, upon a wafer (not shown); and a wafer stage 11 for holding thereon the wafer The illuminance distribution measuring system includes a two-dimensional image pickup device unit 8 and an image signal processing device 9. The image pickup device unit 8 includes a two-dimensional (area) image pickup device 8a which comprises, in this embodiment, a number of arrayed picture elements. A known type CCD (charge coupled device) sensor array or otherwise may be used as the image pickup device 8a. Output signals (image signals) of the image pickup device 8a are supplied by way of a signal line 8b to the image signal processing device 9, wherein the image signals are stored and processed as required. Denoted at 10 in FIG. 1 is a controller which is operable to control the operation of the exposure apparatus as a whole.

While the image pickup device unit 8 is communicated with the image signal processing device 9 by way of the signal line 8b, the unit 8 as a whole is not fixedly secured, but is made detachable and movable within the extent as determined by the length of the signal line 8b. In the state shown in FIG. 1, the image pickup device unit 8a is placed on the wafer stage 11 of the exposure apparatus.

The optical illumination system which is used in the FIG. 1 example and which includes the beam scanner 3, the fly's-eye lens system 5 and the condenser lens 6, is of a known type such as described in detail in U.S. Pat. No. 4,619,508.

In the operation of the structure described hereinbefore, the light 2 emitted from the excimer laser 1 is directed through the beam scanner 3 to the fly's-eye lens system 5 and passes therethrough. The light from the fly's-eye lens system 5 passes through the condenser lens 6 and the projection lens system 12, whereby it is directed to the region which is to be illuminated. On this region, the two-dimensional image pickup device 8a is placed. Thus, the light intensity distribution upon that region can be detected in the form of electric signals which are supplied to the image signal processing device 9 and which are stored and processed into numerical values.

In the present embodiment, the region to be illuminated or being illuminated (which is the subject of examination) corresponds to a unit shot area (unit exposure region) on a wafer as it is placed on the wafer stage 11 for step-and-repeat exposures. Thus, the two-dimensional image pickup device 8a used in the present embodiment has a light-receiving surface (picture element array) whose size is sufficiently large to cover such an exposure region on the wafer. Also, the position of the light-receiving surface of the image pickup device with respect to the direction of an optical axis of the projection lens system 12, at the time of measurement, is set so that it is substantially coincident with the surface position of a wafer as it is placed on the wafer stage 11.

Description will now be made of details of the manner of detecting the illuminance distribution.

Figure 2:
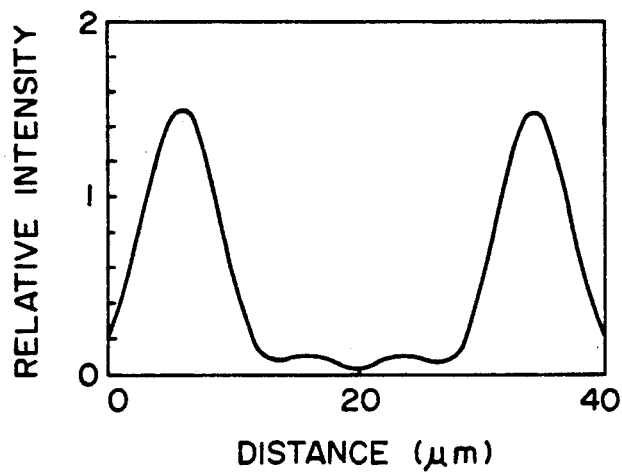
FIG. 2 is a graph showing an interference fringe pattern formed on a surface being illuminated.

Generally, as a phenomenon which is peculiar to an exposure apparatus having, as a light source, a laser device of the described type, there occurs a fine interference pattern on the surface being illuminated by a laser beam from the laser device. This results from the light 2 having high coherency and being divided by single-lens elements of the fly's-eye lens system 5 to be superposed one upon another on the region being illuminated. Such an interference pattern provides a light intensity distribution, an example of which, is illustrated in FIG. 2. In the graph of FIG. 2, the axis of the abscissa denotes the rectilinear distance on the region being illuminated, while the axis of the ordinate denotes the relative intensity of the light being projected. The positions of peaks which appear in the graph of FIG. 2 are variable with the change in the angle of incidence of the light 2 upon the fly's-eye lens system 5. Accordingly, in an exposure apparatus of the described type, it is possible to make the total or integrated amount of exposure on the surface (region) being illuminated uniform, by changing the angle of incidence of the light 2 upon the fly's-eye lens system 5 by means of the beam scanner 3.

However, if a conventional scan type small-size photodetector is used to examine the degree of uniformness (i.e. irregularity) in the amount of exposure by such an exposure apparatus wherein the angle of light incidence is changed it is difficult to accurately detect the unevenness in the total or integrated exposure amount as established when multipulse exposure while using the beam scanner is completed.

The illuminance distribution as it is finally determined as a result of multi-pulse exposure can be measured by the measuring system of the present embodiment. Namely, in the present embodiment, the amount of exposure a detected by each picture element of the image pickup device 8 (with the angle of incidence of the light 2 being changed for each pulse emission) is stored into a memory of the image signal processing device 9 so that, for each picture element, an integrated exposure amount by a predetermined number of pulses is detected. Thus, for all the picture elements of the image pickup device 8a, a corresponding number of integrated exposure amounts are obtainable and, on the basis of the thus obtained integrated exposure amounts, the illuminance distribution can be determined by calculation.

To accomplish this, upon measurement, the controller 10 operates to synchronize the excimer laser 1, the scanner driving device 4 and the image signal processing device 9. More specifically, in this embodiment, each time the beam scanner 3 operates to change the angle of incidence of the light 2 by a predetermined amount (a unit angle) under the influence of the scanner driving device 4, the excimer laser 1 is actuated to emit one pulse and, simultaneously therewith, the image signal processing device 9 samples the signals from the image pickup device 8a.

The number of pulses to be used for the measurement of the illuminance distribution is preferably set so as to be equal to the number of pulses for the actual exposure of one exposure region on a wafer by use of a pulsed laser beam. Further, the scanning deflection of the pulsed laser beam 2 by the beam scanner 3 can be carried out under the same condition or conditions as the actual exposure of a wafer. Accordingly, the illuminance distribution on the surface being illuminated can be accurately measured without being affected by interference fringes, scanning the surface being illuminated.

Additionally, use of a two-dimensional image pickup device (a charge coupled device), for example, as a sensor array can effectively improve the resolution of the measurement of the illuminance distribution.

In a case when the pulsed laser beam from an excimer laser 1 has too high an intensity so that the illuminance per one pulse is too high, it is possible that the output of the image pickup device is saturated. In such a case, it is desirable to provide a filter element, such as an ND filter or otherwise on the path of the pulsed laser beam, preferably at a portion thereof which is upstream of a mask with respect to the direction of advancement of the light, whereby the intensity of the pulsed laser beam is decreased. By doing so, the illuminance distribution can be measured exactly.

While, in this embodiment, the measurement of the illuminance distribution is carried out at a position corresponding to the wafer surface, it may, of course, be conducted at any other position such as a position corresponding to the surface of a mask. The illuminance distribution upon any surface being illuminated, such as a mask surface, can be measured with the measuring system of the present embodiment. Further, the optical arrangement may be modified so as to form a position which is optically equivalent to a mask surface or a wafer surface, and the measurement of the illuminance distribution may be carried out at such a position. In this case, additionally, the diameter of a light beam irradiating that position may be enlarged or reduced and, by doing so, the resolution of the illuminance distribution measurement can be increased (if the beam diameter is enlarged) or a sensor array which is smaller in size can be used (if the beam diameter is reduced).

In accordance with the illuminance distribution measuring system according to the present embodiment, as described hereinbefore, a two-dimensional sensor array is disposed on the surface being illuminated by a pulsed laser beam and the illuminance distribution on that surface is measured on the basis of the output signals of the sensor array. Accordingly, the illuminance distribution can be measured quickly and accurately.

Further, a two-dimensional image pickup device may receive a pulsed light comprising plural laser beam pulses and, for each picture element of the image pickup device, the exposure amount may be integrated. The measurement of the illuminance distribution based on the detection of integrated exposure amounts by the picture elements of the image pickup device ensures further improvement of the measurement accuracy.

While the invention has been described with reference to the structures disclosed herein, it is not confined to the details set forth and this application is intended to cover such modifications or changes as may come within the purposes of the improvements or the scope of the following claims.

What is claimed is:

1. An illuminance distribution measuring system for measuring an illuminance distribution on a predetermined plane irradiated by a pulsed laser beam, said measuring system comprising:
   a two dimensional sensor array unit for being irradiated by the pulsed laser beam; and
   determining means for determining the illuminance distribution on the plane being irradiated, said determining means comprising means for detecting the illuminance distribution on the basis of a plurality of respective output signals from said sensor array unit in response to being irradiated by a plurality of pulses of the laser beam.

2. A system according to claim 1, wherein said sensor array unit comprises a two-dimensional sensor array including an image pickup device.

3. A system according to claim 1, wherein said sensor array unit comprises a two-dimensional sensor array sensitive to a pulsed laser beam emitted by an excimer laser.

4. A system according to claim 1, wherein said sensor array unit comprises a plurality of sensors and said determining means further comprises means for integrating the output signals produced from each sensor of said sensor array unit in response to being irradiated by the plurality of pulses from the laser beam, and wherein the illuminance distribution on the predetermined plane is detected on the basis of the result of integration of the output signals from each sensor.

5. A projection exposure apparatus for use in manufacture of semiconductor devices, said apparatus comprising:
   a first stage for carrying thereon a mask including a pattern;
   a second stage for carrying thereon a semiconductor wafer;
   an illumination system for illuminating the mask with a plurality of laser pulses;
   a projection optical system provided between said first and second stages for projecting the pattern of the mask being illuminated with the laser pulses on the semiconductor wafer; and
   measuring means comprising a two-dimensional sensor array unit provided on said second stage for measuring an illuminance distribution in a region below said projection optical system on the basis of a plurality of respective output signals produced from said sensor array unit in response to being irradiated by a plurality of laser pulses from said illumination system.

6. An apparatus according to claim 5, wherein said illumination system comprises an excimer laser for emitting laser pulses.

7. An apparatus according to claim 5, wherein said sensor array unit removably mounted on said second stage.

8. An apparatus according to claim 5, wherein said sensor array unit comprises a light receiving surface disposed at substantially the same height as the surface of the semiconductor wafer to be exposed to the pattern of the mask, when the semiconductor wafer is placed on said second stage.

9. The apparatus according to claim 5, wherein said illumination system comprises a laser for emitting laser pulses and an optical system for directing the laser pulses to the mask, said optical system comprising a scanner for scanningly deflecting each laser pulse and means for actuating said scanner.

10. An apparatus according to claim 9, wherein said measuring means receives output signals from said sensor array unit in synchronism with emission of a laser pulse from said laser and scanning deflection of the laser pulse by said scanner.

11. An apparatus according to claim 18, wherein said sensor array unit comprises a plurality of sensors and said measuring means further comprises means for integrating output signals from each sensor of said sensor array unit produced in response to being irradiated by the plurality of laser pulses, and wherein the illuminance distribution in the region is detected on the basis of the result of integration of the output signals from each sensor.

12. An apparatus according to claim 11, wherein said sensor array unit is irradiated with the same number of laser pulses projecting the pattern of the mask on the semiconductor wafer for exposure.

13. A system for measuring illuminance distribution on a plane irradiated with a pulsed laser beam from a laser, said system comprising:
   photoelectric converting means for receiving pulses of laser beam from the laser at different points on the plane; and
   processing means cooperable with said photoelectric converting means, for determining the illuminance distribution on the plane, on the basis of integrated exposure amount at each point on the plane, provided by the laser beam pulses received at that point by said photoelectric converting means.

14. A system according to claim 13, wherein said photoelectric converting means includes an image pickup device.

15. A system according to claim 13, wherein said photoelectric converting means produces, in sequence, those signals corresponding to the light quantities of the laser beam pulses received, in sequence, at that point by said photoelectric converting means, and wherein said processing means includes signal forming means for forming a signal corresponding to the integrated exposure amount based on the integration of the signals from said photoelectric converting means.

16. A method of measuring illuminance distribution on a plane irradiated with a pulsed laser beam from a laser, said method comprising the steps of:
   irradiating different points on the plane with pulses of laser beam from the laser;
   integrating exposures at each point on the plane, as provided by the laser beam pulses incident on that point; and
   determining the illuminance distribution on the plane, on the basis of the integrated exposures at the different points on the plane.

17. An illuminance measuring method usable in an exposure apparatus with an excimer laser, for measuring illuminance distribution on a plane irradiated with a pulsed laser beam from the excimer laser, said step comprising the steps of:

irradiating different points on the plane with pulses of laser beam from the excimer laser;

integrating exposures at each point on the plane, as provided by the laser beam pulses incident on that point; and determining the illuminance distribution on the plane, on the basis of the integrated exposures at the different points on the plane.

18. A method according to claim 17, wherein integration of the exposures at each point on the plane includes photoelectric conversion of the laser beam pulses incident on that point, through a sensor provided on a stage member on which a substrate to be exposed by the exposure apparatus is placed.

19. A method according to claim 18, wherein the plane is substantially at the same height as the surface of the substrate placed on the stage member.

20. A projection exposure apparatus for manufacture of semiconductor devices, said apparatus comprising:
a first stage for supporting a mask;
a second stage for supporting a wafer;
an illumination system including a laser, for illuminating the mask with a pulsed laser beam from the laser;
a projection optical system provided between said first and second stages, for projecting to the wafer an image of the mask irradiated with the pulsed laser beam from the laser; and
a measuring system for measuring illuminance distribution on a zone below said projection optical system, said measuring system being effective to detect an integrated exposure at each of different points in the zone, as provided by pulses of laser beam from said laser incident on that point, to determine the illuminance distribution on the zone on the basis of the integrated exposures at the different points in the zone.

21. An apparatus according to claim 20, wherein said measuring system includes a sensor having a light receiving surface, for receiving pulses of laser beam from said laser at each point in the zone, and wherein said sensor is provided on said second stage so that the light receiving surface of said sensor is placed substantially at the same height as the surface of the wafer supported by said second stage.

22. An apparatus according to claim 21, wherein said illumination system includes an illuminated optical system for directing the pulsed laser beam from said laser to the mask, and wherein said illumination optical system includes a scanner for scanningly deflecting the pulsed laser beam from said laser.

23. An apparatus according to claim 22, wherein said illumination optical system further includes an optical integrator, and wherein said scanner is disposed between said laser and said optical integrator.

24. An apparatus according to claim 23, wherein said laser comprises an excimer laser.

25. An apparatus according to claim 21, wherein said sensor produces, in sequence, those signals corresponding to the light quantities of the laser beam pulses received, in sequence, at that point by said sensor, and wherein said measuring system further includes signal forming means for forming a signal corresponding to the integrated exposure at that point based on the integration of the signals from said sensor.

26. An apparatus according to claim 22, wherein said illumination system and said scanner are so arranged that a plurality of laser beam pulses, of a predetermined number, from said laser are sequentially deflected to irradiate the mask and, with said scanner, a plurality of laser beam pulses, of the predetermined number from said laser are sequentially deflected to irradiate the zone.

27. A method of evaluating an illuminance distribution on a predetermined plane for manufacture of semiconductor devices wherein a wafer is placed on the predetermined plane and patterns are superposedly projected on the wafer with a plurality of laser beam pulses from a laser, said method comprising the steps of:
irradiating different points on the predetermined plane with the plurality of laser beam pulses;
integrating exposures at each of the different points on the plane, as provided by the plurality of laser beam pulses incident on the different points; and
determining the illuminance distribution on the plane on the basis of the integrated exposures at the different points on the plane.

28. A method according to claim 27, wherein said irradiating step comprises irradiating the different points with a plurality of excimer laser beam pulses.

29. A method according to claim 27, further comprising scanningly deflecting the plurality of laser beam pulses in sequence and directing the scanningly defected pulses to irradiate the predetermined plane for superposedly projecting the patterns on the wafer and for integrating the exposures.

30. A method according to claim 27, further comprising using the same number of predetermined laser beam pulses for the superposed projection of the patterns on the wafer and for the integration of the exposures.

31. A method according to claim 28, further comprising using the same number of predetermined laser beam pulses for the superposed projection of the patterns on the wafer and for the integration of the exposures.

32. A method according to claim 29, further comprising using the same number of predetermined laser beam pulses for the superposed projection of the patterns on the wafer and for the integration of the exposures.

* * * * *

UNITED STATES PATENT AND TRADEMARK OFFICE
CERTIFICATE OF CORRECTION

PATENT NO. : 5,067,811

DATED : November 26, 1991

INVENTOR(S) : Chidane Ouchi

It is certified that error appears in the above-identified patent and that said Letters Patent is hereby corrected as shown below:

COLUMN 1

Line 21, "the" (first occurrence) should be deleted; and
Line 35, "there," should read --there--.

COLUMN 2

Line 3, "semi-conductor" should read --semiconductor--;
Line 16, "a" (second occurrence) should read --an--;
Line 18, "preset" should read --present--; and
Line 34, "wafer" should read --wafer.--.

COLUMN 3

Line 32, "which," should read --which--;
Line 49, "changed it" should read --changed, it--; and
Line 57, "a" should read --as--.

UNITED STATES PATENT AND TRADEMARK OFFICE
CERTIFICATE OF CORRECTION

PATENT NO. : 5,067,811

DATED : November 26, 1991

INVENTOR(S) : Chidane Ouchi

Page 2 of 2

It is certified that error appears in the above-identified patent and that said Letters Patent is hereby corrected as shown below:

COLUMN 5

Line 15, "two dimensional" should read --two-dimensional--; and

Line 65, "removably" should read --is removably--.

COLUMN 6

Line 5, "The" should read --An--;

Line 16, "claim 18," should read --claim 10,--; and

Line 67, "said step" should read --said method--.

COLUMN 7

Line 49, "illuminated" should read --illumination--.

Signed and Sealed this

Fourth Day of May, 1993

*Attest:*

MICHAEL K. KIRK

*Attesting Officer*  Acting Commissioner of Patents and Trademarks